(12) United States Patent
Sanji et al.

(10) Patent No.: US 11,330,751 B2
(45) Date of Patent: May 10, 2022

(54) BOARD WORK MACHINE

(71) Applicant: FUJI CORPORATION, Chiryu (JP)

(72) Inventors: Mitsuru Sanji, Toyota (JP); Shigenori Sengoku, Anjo (JP)

(73) Assignee: FUJI CORPORATION, Chiryu (JP)

( * ) Notice: Subject to any disclaimer, the term of this patent is extended or adjusted under 35 U.S.C. 154(b) by 272 days.

(21) Appl. No.: 16/498,931

(22) PCT Filed: Mar. 31, 2017

(86) PCT No.: PCT/JP2017/013829
§ 371 (c)(1),
(2) Date: Sep. 27, 2019

(87) PCT Pub. No.: WO2018/179429
PCT Pub. Date: Oct. 4, 2018

(65) Prior Publication Data
US 2020/0029479 A1 Jan. 23, 2020

(51) Int. Cl.
*H05K 13/08* (2006.01)
*G05B 19/418* (2006.01)

(52) U.S. Cl.
CPC ... *H05K 13/0882* (2018.08); *G05B 19/41805* (2013.01); *G05B 2219/45026* (2013.01)

(58) Field of Classification Search
CPC .......... H05K 13/0882; G05B 19/41805; G05B 219/45026
USPC ....................................................... 700/121
See application file for complete search history.

(56) References Cited

U.S. PATENT DOCUMENTS

| | | | | |
|---|---|---|---|---|
| 2002/0069395 A1* | 6/2002 | Fujiwara | ............... | H05K 13/083 716/112 |
| 2004/0073322 A1* | 4/2004 | Maenishi | ........... | H05K 13/0452 700/28 |
| 2004/0080897 A1* | 4/2004 | Kodama | ............ | H05K 13/0882 361/234 |

(Continued)

FOREIGN PATENT DOCUMENTS

| | | |
|---|---|---|
| EP | 3 076 776 A1 | 10/2016 |
| JP | 2004-186175 A | 7/2004 |
| JP | 2015-60956 A | 3/2015 |

OTHER PUBLICATIONS

International Search Report dated Jun. 20, 2017 in PCT/JP2017/013829, 1 page.

*Primary Examiner* — Robert A Cassity
(74) *Attorney, Agent, or Firm* — Oblon, McClelland, Maier & Neustadt, L.L.P.

(57) ABSTRACT

There is provided a board work machine (a component mounting machine) including a data registration section for registering in advance multiple data (ultra-high precision data, high precision data, normal precision data) for each characteristic of a member constituting a base material for a circuit board in accordance with the type and characteristic of the member; a work performing section (a part camera) for performing work using the member or performing work on the member while selecting one item of data from the multiple data for reference; and an automatic data switching section for automatically switching among the multiple member data that the work performing section refers to in accordance with the performing situation of the work performed by the work performing section.

14 Claims, 3 Drawing Sheets

(56) References Cited

U.S. PATENT DOCUMENTS

| | | | |
|---|---|---|---|
| 2006/0185162 A1* | 8/2006 | Aoki | H05K 13/0853 29/832 |
| 2010/0249971 A1* | 9/2010 | Maenishi | H05K 13/085 700/102 |
| 2016/0227682 A1* | 8/2016 | Matsuda | H05K 13/0413 |
| 2016/0360657 A1* | 12/2016 | Oyama | H05K 13/0434 |
| 2017/0151673 A1* | 6/2017 | Kobayashi | B25J 9/1697 |
| 2017/0287310 A1* | 10/2017 | Yamamoto | G07C 3/08 |

* cited by examiner

BOARD WORK MACHINE

TECHNICAL FIELD

The present application relates to a board work machine for performing predetermined work on a board.

BACKGROUND ART

Techniques for mass production of circuit boards by performing various types of work (hereinafter, referred to as board work) for mounting electronic components (hereinafter referred to as components) on a board on which wiring is printed have been widely applied. A solder printing machine, a component mounting machine, a reflow machine, a board inspection machine, and the like are examples of a board work machine for performing board work. It is general practice that these board work machines are coupled together to make up a component mounting line. Among these board work machines, the component mounting machine performs component mounting work while referring to member data in which shape information, handling conditions, and the like boards and components are registered in advance.

Here, even with members having the same member data, due to differences in lot, supplier, and the like, slight differences may occur among the members. These slight differences may cause problems. For example, in imaging a member to recognize it through image processing, a slight difference can cause an image processing error. In the related art, when an image processing error occurs, the operator re-edits the member data and continues using the data. However, since the component mounting machine is stopped during the editing work, the production of circuit boards is interrupted, thereby reducing the production efficiency. In addition, the editing work performed by the operator involves some complicated labor. Patent Literature 1 discloses an example of a technique for performing mounting work while referring to member data.

In a component mounting machine disclosed in Patent Literature 1, a component picked up by a suction nozzle is imaged, and whether the component is acceptable or unacceptable is determined through component recognition. When the component is determined to be unacceptable, the operator determines whether to discard the component based on the captured image of the component. Further, when determining not to discard a component, the operator modifies component library data (the member data) for a retry operation. With this technique, in the case where component recognition failure occurs in a first mounting operation after a board machine type has been switched, it is considered that not only can discarding of components can be prevented but that also the starting up of a production operation can be assisted.

PATENT LITERATURE

Patent Literature 1: JP-A-2004-186175

BRIEF SUMMARY

Technical Problem

The technique disclosed by Patent Literature 1 is a post-processing countermeasure technique when an image processing error occurs at the time of component recognition, and the problem inherent to the related art is not necessarily solved. In other words, with the post-processing countermeasure technique, not only is the start-up of the production operation delayed, but time and labor of the operator is required. Similar problems can occur in board work machines other than the component mounting machine. For example, in the event that a position reference mark printed on a board becomes blurred and difficult to see, a recognition error of stopping positions for boards can occur on many board work machines.

A problem to be solved by the present description is how to provide a board work machine that can reduce the effort to be expended by the operator by automatically switching member data to be referred to in the board work machine.

Solution to Problem

The present description discloses a board work machine including: a data registration section for registering in advance multiple data for each characteristic of a member constituting a base material for a circuit board in accordance with the type and characteristic of the member; a work performing section for performing work using the member or performing work on the member while selecting one item of data from the multiple data for reference; and an automatic data switching section for automatically switching among the multiple member data that the work performing section refers to in accordance with the performing situation of the work performed by the work performing section.

Advantageous Effects

With the board work machine disclosed in the present description, since the multiple data are registered for each characteristic of the member, the member data can automatically be switched over when the work performing situation of the work performing section changes. Due to this, being different from the post-processing countermeasure technique in the related art, the operator does not have to switch the member data manually. Therefore, in this board work machine, the effort that the operator has to expend is reduced.

DESCRIPTION OF AN EMBODIMENT

Figure 1:
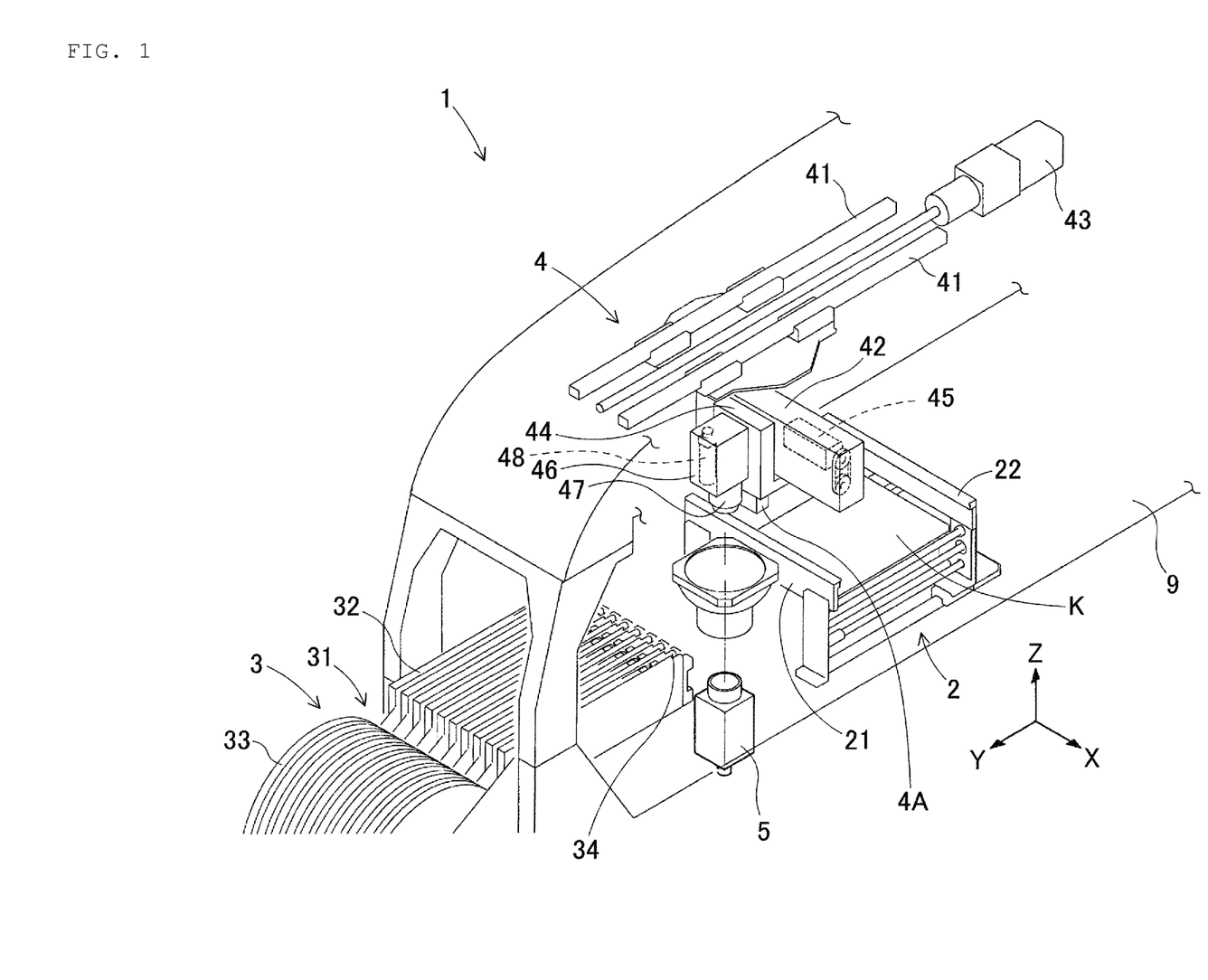
FIG. 1 is a perspective view showing the structure of the main part of a component mounting machine constituting a board work machine of an embodiment.

1. Structure of Board Work Machine (Component Mounting Machine 1) of an Embodiment Referring to FIGS. 1 to 4, a board work machine of an embodiment will be described with reference to component mounting machine 1 as an example. FIG. 1 is a perspective view showing the structure of the main part of component mounting machine 1 constituting a board work machine of the embodiment. In FIG. 1, the direction from the upper-left towards the lower-right denotes the X-axis direction in which a board is conveyed, and the direction from the upper-right towards the lower-left denotes the Y-axis direction constituting the front-rear direction of component mounting machine 1. Board K is a base board from which a circuit board is fabricated or a board in process on which some board work has not yet been completed. Component mounting machine 1 includes board conveyance device 2, component supply device 3, component transfer device 4, part camera 5, control section 6 (refer to FIG. 2), a device table 9, and the like.

Board conveyance device 2 is made up of first guide rail 21 and second guide rail 22, a pair of conveyor belts, a clamping device, and the like. First guide rail 21 and second guide rail 22 are assembled on to device table 9 in such a manner as to extend in the X-axis direction across the upper center of device table 9 and parallel to each other. The pair of conveyor belts arranged in parallel to each other are provided side by side directly under first guide rail 21 and second guide rail 22. The pair of conveyor belts rotate with board K rested on a conveyor conveyance surface thereof and conveys board K to and from a mounting execution position set at the central section of device table 9. A clamping device is provided at the central section of device table 9 directly below the conveyor belts. The clamping device pushes up board K with multiple push-up pins, clamps board K in a horizontal orientation, and positions board K in the mounting execution position.

Component supply device 3 is provided at the front side of component mounting machine 1. Component supply device 3 is made up of multiple detachable cassette-type feeders 31. Cassette-type feeder 31 includes main body 32, supply reel 33 provided at the front side of main body 32, and component take-out section 34 provided at the upper portion of the rear end of main body 32. A carrier tape on which multiple components are sealed in at a predetermined pitch is wound to be held around supply reel 33. The carrier tape is fed out at a predetermined pitch by a tape feeding mechanism omitted from illustration. As a result, components are released from a sealed state and are sequentially sent to component take-out section 34.

Component transfer device 4 is made up of a pair of Y-axis rails 41, Y-axis moving table 42, Y-axis motor 43, X-axis moving table 44, X-axis motor 45, mounting head 46, rotary tool 47, Z-axis motor 48, and the like. The pair of Y-axis rails 41 are disposed to lie from a rear section of device table 9 to above part of component supply device 3 at the front portion of device table 9. Y-axis moving table 42 is loaded on the pair of Y-axis rails 41. Y-axis moving table 42 is driven from Y-axis motor 43 via a ball screw mechanism and moves in the Y-axis direction. X-axis moving table 44 is loaded on Y-axis moving table 42. X-axis moving table 44 is driven from X-axis motor 45 via a ball screw mechanism and moves in the X-axis direction.

Mounting head 46 is disposed at the front side of X-axis moving table 44. Mounting head 46 has rotary tool 47 on the lower side thereof. Although not shown in FIG. 1, multiple suction nozzles are arranged into an annular shape on the lower side of rotary tool 47. The multiple suction nozzles are revolved on the lower side of rotary tool 47, and one of them is selected. The selected suction nozzle is driven by Z-axis motor 48 to be lifted up and lowered to pick up a component and mount the component on board K. The present disclosure is not limited to this configuration, and hence, mounting head 46 may have a holding type mounting tool for holding a component between its constituent members.

Part camera 5 is provided while facing upwards on the upper surface of device table 9 between board conveyance device 2 and component supply device 3. Part camera 5 images components that are picked up at component take-out section 34 by the multiple suction nozzles being moved to board K. As a result, part camera 5 can collectively image the components held by the multiple suction nozzles. The captured image data is subjected to image processing, and the suction holding state of the components is confirmed. When a deviation in suction holding position or rotation angle of the component or a bent lead is confirmed, the mounting operation is minutely adjusted as required. Components that are difficult to mount are discarded.

2. Control Configuration of Component Mounting Machine 1 and Member Data

Figure 2:
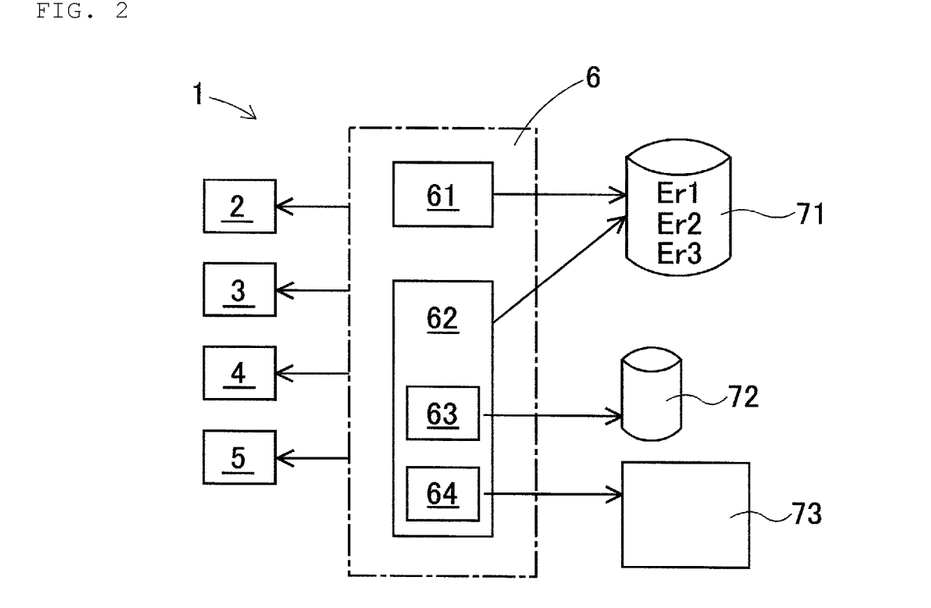
FIG. 2 is a block diagram showing a control configuration of the component mounting machine.

FIG. 2 is a block diagram showing a control configuration of component mounting machine 1. Control section 6 controls board conveyance device 2, component supply device 3, component transfer device 4, and part camera 5, which collectively correspond to a work performing section. Control section 6 is configured using a computer device operating software with a CPU. As shown in FIG. 2, control section 6 includes data registration section 61 and automatic data switching section 62. Further, automatic data switching section 62 includes history record section 63 and downstream transmission section 64.

Figure 3:
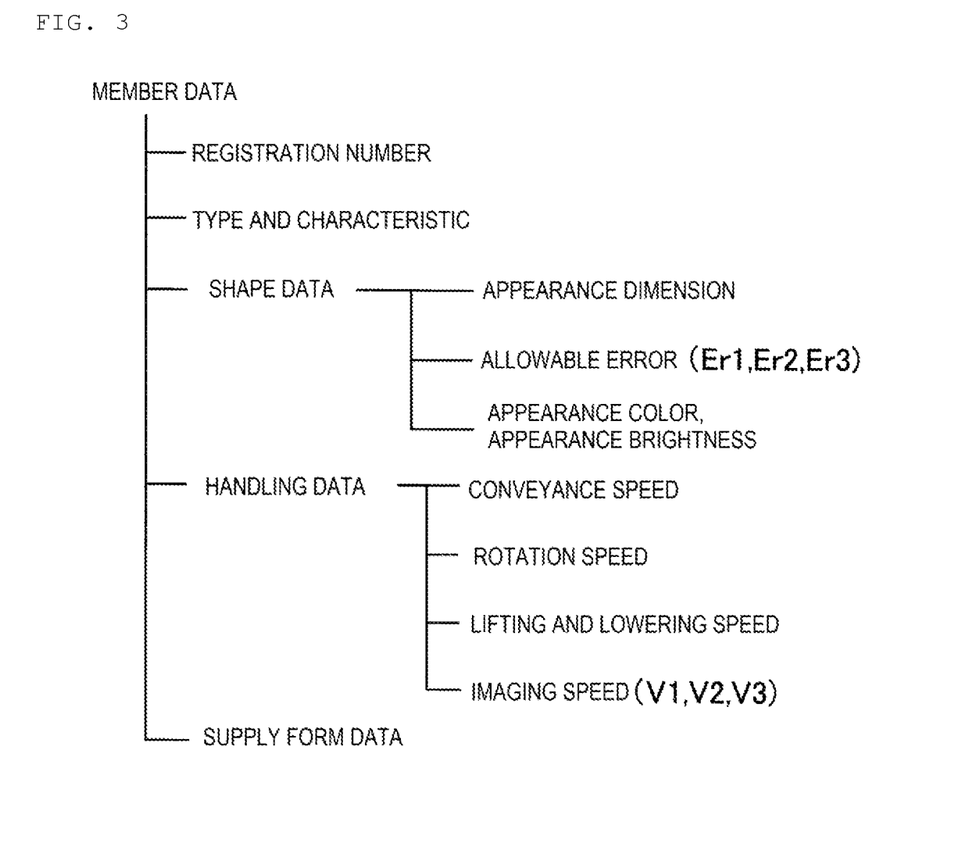
FIG. 3 is a diagram showing examples of registration items of member data.

In accordance with the type and characteristic of a member constituting a base material for a circuit board, data registration section 61 registers in advance multiple member data for each characteristic in member data base 71. FIG. 3 is a diagram showing examples of registration items of member data. In the examples shown in FIG. 3, the registration items of the member data include the registration number, the type and characteristic of members, shape data, handling data, and supply form data.

The type of a member denotes the form that the member takes such as board K, a component, paste solder, or the like. The characteristic of a member denotes, for example, the difference in size of board K, the difference in the pattern of printed wiring, the difference in lot, the difference in supplier, and the like. Also, even with boards K of the same type, the front surface and the rear surface may be treated as different characteristics. Additionally, the characteristic of a member denotes, for example, the difference in size of a component; the difference in resistance, condenser, IC, and the like; the difference in lot; and the difference in supplier. Further, even with two resistance components of the same size, when their resistance values as electric characteristic values are different, those two resistance components are treated as components having different characteristics. Registration numbers are assigned in accordance with the types and characteristics of members. Registration numbers become necessary when accessing member database 71 to read member data.

The shape data is data such as the standard values for the physical dimensions of a member, the allowable error in the physical dimensions, the color or brightness of the member, and the like. For example, the shape data of board K includes the length, the width, and the thickness of board K, and allowable errors of these three dimensions. The shape data of board K includes information obtained by digitizing the color or brightness of the ground color of board K. In addition, the shape data of board K includes information regarding the shape and position of a position reference mark attached to board K.

The shape data of a component includes the dimensions of the component in the longitudinal, lateral, and height directions, and allowable errors in these three dimensions. The shape data of a component includes information obtained by digitizing the color or brightness of the component. The color or brightness of a component is referred to when the component is imaged by part camera 5 to detect the contour of the component. In addition, the shape data of a component includes information regarding the shape and position of leads or electrodes for making electrical connections.

The handling data is data for handling conditions registered for each characteristic of the member. For example, the handling data of board K includes information regarding the conveyance speed at which board K is conveyed by board conveyance device 2 and the arrangement of multiple push-up pins of the clamping device. In addition, for example, the handling data of components includes the conveyance speed at which a component is conveyed through movement of moving Y-axis moving table 42 and X-axis moving table 44, rotation speeds of rotary tool 47 and suction nozzle, and lifting and lowering speeds of the suction nozzle. Further, the handling data of components includes the imaging speed at which a component is imaged by part camera 5. That is, the suction nozzle and the component may move at a speed equal to or lower than the registered imaging speed when the suction nozzle and component are imaged by part camera 5.

The supply form data is data denoting the form of supply when a member is supplied. For example, a carrier tape wound around a reel, a tray having two-dimensional lattice-like cavities, or the like is registered as forms of supply of components. In addition, information on the number of components per tape or per tray is also included in the supply form data.

Specifically, data registration sectioning 61 registers multiple member data in member database 71 for part of the registered items of a certain member. Member database 71 is provided in an external storage device separate from component mounting machine 1 and can be accessed from control section 6. In the present embodiment, multiple member data are registration items regarding allowable errors in the shape data. That is, multiple of ultra-high precision data Er1, high precision data Er2, and ordinary precision data Er3 are registered as allowable errors.

Ultra-high precision data Er1 is first member data having the smallest allowable error and the highest performing precision in mounting work of mounting a component on board K. High-precision data Er2 is second member data having the second smallest allowable error and the second highest performing precision in mounting work. Normal precision data Er3 is third member data having the third smallest allowable error and having a normal performing precision in mounting work. Even if precision management using normal precision date Er3 is performed, a circuit board can have a predetermined performance. Member data from a fourth or greater level of allowable errors may be registered within a range where the performance of a circuit board can be ensured.

On the other hand, in precision management using ultra-high precision data Er1, an error classified as a failure of performing normal work is most likely to occur. In precision management using high precision data Er2, such an error is second most likely to occur, and in precision management using normal precision data Er3, the error is unlikely to occur. In the present embodiment, an error in confirming the suction state of a component by imaging with part camera 5 (hereinafter, referred to simply as "confirmation work"), which is work constituting part of the mounting work, will be described as an example of an error.

Data registration section 61 sets priorities to the multiple member data in order to enhance the performing precision of the confirmation work of part camera 5. That is, data registration section 61 sets a first priority on ultra-high precision data Er1 (first member data). Data registration section 61 sets a second priority on high-precision data Er2 (second member data) and sets a third priority on normal precision data Er3 (third member data).

Automatic data switching section 62 automatically switches among first to third member data that the work performing section refers to in accordance with the work performing situation of the work performing section. Following the switching control of automatic data switching section 62, the work performing section selects one from the multiple member data and performs work using the member or work on the member while referring to the member data so selected.

In other words, automatic data switching section 62 automatically switches among ultra-high precision data Er1, high-precision data Er2, and normal-precision data Er3 in accordance with the performing situation of confirmation work by part camera 5. Following the switching control by automatic data switching section 62, part camera 5 selects one from ultra-high precision data Er1, high-precision data Er2, and normal-precision data Er3 and performs confirmation work while referring to the member data so selected. Here, although the member data are switched among ultra-high precision data Er1, high-precision data Er2, and normal-precision data Er3, member data can also be prepared which are switched for supplier or lot.

Specifically, automatic data switching section 62 firstly employs ultra-high precision data Er1 to which the first priority is set, the first priority corresponding to the highest performing precision. Then, in the case where an error occurs in the confirmation work by part camera 5, automatic data switching section 62 automatically switches the member data from ultra-high precision data Er1 to high-precision data Er2 to which the second priority is set, causing part camera 5 to perform the confirmation work again. Further, in the case where an error also occurs even when high-precision data Er2 is used, automatic data switching section 62 automatically switches the member data from high-precision data Er2 to normal-precision data Er3 to which the third priority is set, causing part camera 5 to perform the confirmation work again.

In addition, history record section 63 records the information that the member data is automatically switched in history database 72. History database 72 may be provided on either an internal storage device attached to control section 6 or an external storage device. Downstream transmission section 64 transmits the information that the member data is automatically switched to another board work machine 73 on the downstream side. Functions of data registration section 61, automatic data switching section 62, history record section 63, and downstream transmission section 64 will briefly be described when the operation and function of component mounting machine 1 is described below.

3. Operation and Function of Component Mounting Machine 1

Figure 4:
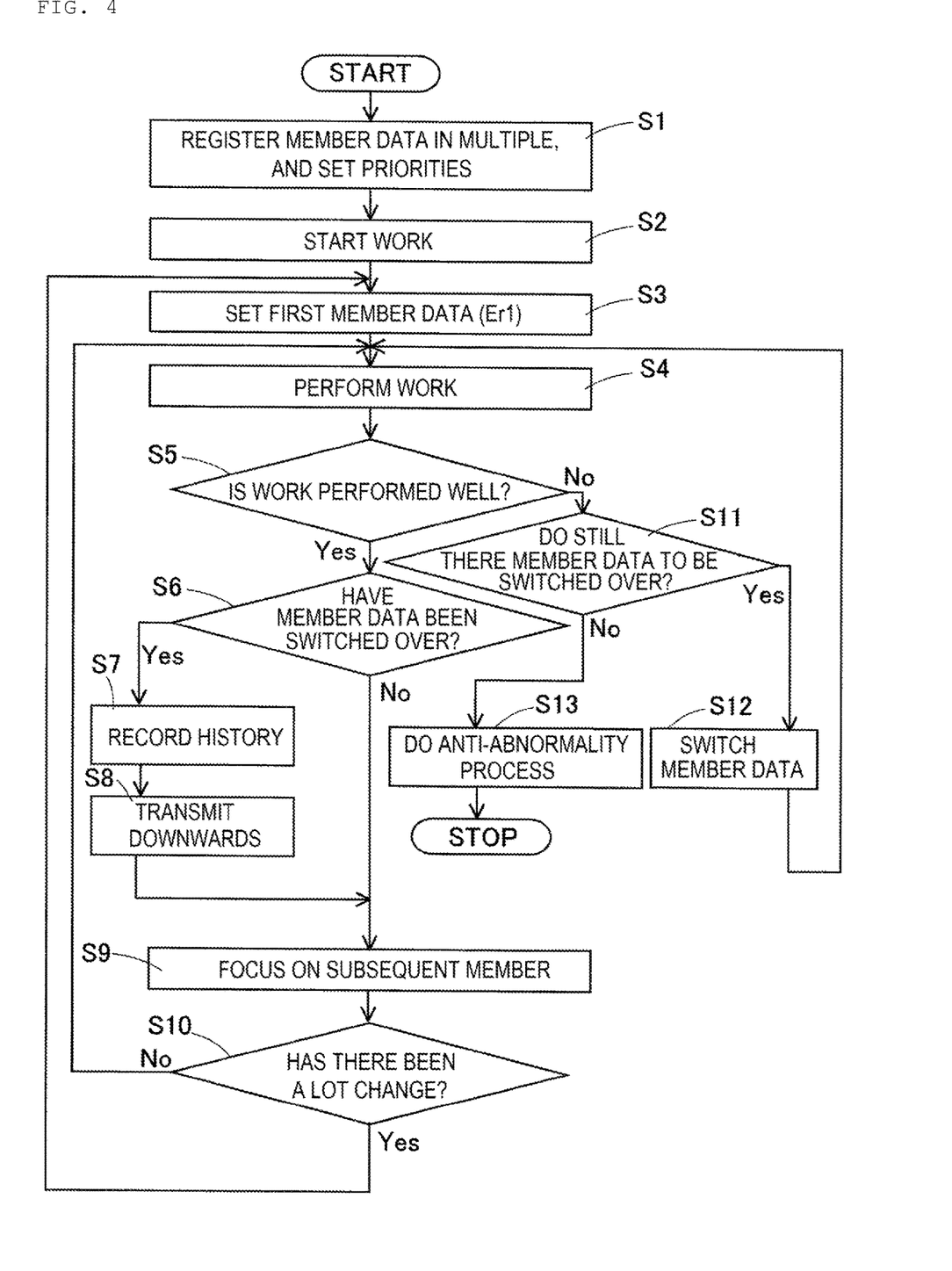
FIG. 4 is a flowchart showing a control flow that is mainly performed by a control section of the component mounting machine.

Next, the operation and function of component mounting machine 1 will be described by referring to a control flow mainly performed by control section 6. FIG. 4 is a flow chart showing a control flow mainly performed by control section 6 of component mounting machine 1. In step S1 of FIG. 1, data registration unit 61 of control section 6 registers member data for a member constituting a base material for a circuit board in member database 71. Further, data registration section 61 registers, as multiple member data, multiple of ultra-high precision data Er1, high precision data Er2, and normal precision data Er3 that individually denote allowable errors in three stages. In addition, data registration section 61 sets the first to third priorities to the multiple of member data registered. The registering and setting operations performed by data registration section 61 may involve an input operation or the like by the operator. In addition, since the member data for the member that has already been used has already been registered in member database 71, the member data in question does not need to be registered again here.

In the next step S2, component mounting machine 1 starts component mounting work. In step S3, automatic data switching section 62 first sets ultra-high precision data Er1 given the first priority for use in precision management. In step S4, component mounting machine 1 performs component mounting work. In the middle of the mounting work, confirmation work is performed by part camera 5. Then, in step S5, automatic data switching section 62 determines whether part camera 5 has performed the confirmation work properly.

In many cases, the confirmation work is performed well, and automatic data switching section 62 continues the mounting work, causing the control flow to proceed to step S6. In step S6, automatic data switching section 62 determines whether the member data are switched over before the confirmation work. In many cases, the member data are not switched over, and automatic data switching section 62 continues the mounting work, causing the control flow to proceed to step S9. In step S9, automatic data switching section 62 focuses on the next component.

In the next step S10, automatic data switching section 62 determines whether the next component is from a new lot. For example, in the case where cassette-type feeders 31 or supply reels 33 of the component supply device 3 are exchanged, automatic data switching section 62 can determine whether the next component is from a new lot. In the case where component supply device 3 is configured to use trays, automatic data switching section 62 can determine whether the next component is from a new lot when trays are exchanged. In many cases, the current lot is continuously used, and automatic data switching section 62 continues the mounting work, causing the control flow to return to step S4.

While the confirmation work is performed properly and the current lot is continuously used, automatic data switching section 62 repeats the loop of control made up of steps S4, S5, S6, S9, and S10. In step S5, however, there may occur a case where the confirmation work fails. In other words, as a result of image processing image data obtained by imaging with part camera 5, an error greater than ultra-high precision data Er1 may occur, and the error is determined to result from a recognition error of a component. In this case, automatic data switching section 62 causes the control flow to proceed to step S11.

In step S11, automatic data switching section 62 determines whether there is still member data to be switched. For example, in the case where initially set ultra-high precision data Er1 is used, high precision data Er2 and normal precision data Er3 still remain. Therefore, automatic data switching section 62 causes the control flow to proceed to step S12, where automatic data switching section 62 automatically switches the member data from ultra-high precision data Er to high precision data Er2. Thereafter, automatic data switching section 62 returns the control flow to step S4.

In step S4 to which the control flow is so returned, automatic data switching section 62 employs high precision data Er2 for precision management and causes part camera 5 to perform confirmation work again. When the confirmation work is performed in the following step S5, automatic data switching section 62 continues the mounting work, causing the control flow to proceed to step S6. As a result, the mounting work can continue by relaxing the precision management within a range where the performance of circuit boards can be ensured. In step S6, automatic data switching section 62 determines whether the member data have been switched over, causing the control flow to proceed to step S7.

In step S7, history record section 63 of automatic data switching section 62 records information that the member data are automatically switched from ultra-high precision data Er1 to high precision data Er2 in history database 72. That is, history record section 63 records the member data before and after the automatic switching and further records information on the sequence of the component in the lot where the automatic switching occurs. As a result, component mounting machine 1 is given a traceability function. In other words, in the event that something problematic occurs, component mounting machine 1 can perform an investigation tracing the automatic member data switching having occurred until then.

In the following step S8, downstream transmission unit 64 of automatic data switching section 62 transmits the information that the member data have been switched from ultra-high precision data Er1 to high precision data Er2 automatically to another board work machine 73 on the downstream side. As a result, board work machine 73 on the downstream side can perform board work using the same member data as those used by component mounting machine 1. In other words, the member data used in the multiple board work machines are always matched.

Thereafter, automatic data switching section 62 continues the mounting work, causing the control flow to proceed to step S9. While the confirmation work using high precision data Er2 is performed properly, and the current lot is continuously used, automatic data switching section 62 repeats the control of the loop made up of steps S4, S5, S6, S9, and S10. That is, automatic data switching section 62 holds the member data of the member in which the error is eliminated for use for members from now on.

In step S5, when the confirmation work fails, automatic data switching section 62 causes the control flow to proceed to step S11 again. In step S11 again, automatic data switching section 62 determines whether there remains member data to be switched. For example, with high precision data Er2 being used, there still remains normal precision data Er3. Therefore, automatic data switching section 62 causes the control flow to step S12 again, where automatic data switching section 62 automatically switches the member data from high precision data Er2 to normal precision data Er3. Thereafter, automatic data switching section 62 returns the control flow to step S4.

In step S4 to which the control flow is so returned, automatic data switching section 62 uses normal precision data Er3 for precision management and causes part camera 5 to perform confirmation work again. When the confirmation work is performed in the following step S5, automatic data switching section 62 continues the mounting work, causing the control flow to proceed to step S6. As a result, the mounting work can continue by relaxing further the precision management within the range where the performance of circuit boards can be ensured. In step S6, automatic data switching section 62 determines whether the member data have been switched over, causing the control flow to proceed to step S7.

In step S7, history record section 63 operates again, and in step S8, downstream transmission section 64 operates again. Thereafter, automatic data switching section 62 causes the control flow to proceed to step 9, and repeats the control of the loop made up of steps S4, S5, S6, S9, and S10.

In step S5, when a third error occurs in the confirmation work, automatic data switching section 62 causes the control flow to proceed to step S11 for the third time. In step S11 to which the control flow is returned for the third time, there remains no member data to be referred to, and automatic data switching section 62 causes the control flow to proceed to step S13. In step S13, control section 6 notifies the operator of an anti-abnormality process and suspends the mounting work temporarily. Thereafter, the operator performs a restoration operation. Normally, it is rare that an error occurs in the confirmation work using normal precision data Er3, and hence, there is not much opportunity where the control in step S13 is performed.

In addition, there may be a case where a new lot is identified in step S10 while repeating the control of the loop made up of steps S4, S5, S6, S9, and S10. In this case, automatic data switching section 62 returns the control flow to step S3. That is, automatic data switching section 62 uses the first member data when lots of members are changed. As a result, although automatic data switching section 62 uses high precision data Er2 or normal precision data Er3 before a change of lots, automatic data switching section 62 uses ultra-high precision data Er1 for a new lot. That is, automatic data switching section 62 is configured to operate to use the highest performing precision at the time of a lot change.

4. One Application Example of the Embodiment

Next, an application example of the embodiment will be described. In one application example, an error in the confirmation work performed by part camera 5 will be considered, the member data that is to be automatically switched differ. In step S1 in FIG. 4, data registration section 61 registers multiple of imaging speeds at three stages at which part camera 5 images a component. Specifically, data registration section 61 registers multiple of high speed data V1 (first member data), low speed data V2 (second member data), and temporary stop data V3 (third member data).

High speed data V1 allows a suction nozzle and a component to pass over part camera 5 at high speeds. Low speed data V2 allows a suction nozzle and a component to pass over part camera 5 at low speeds. Temporary stop data V3 requires a suction nozzle and a component to stop temporarily above part camera 5. On the other hand, the occurrence frequency of an error is highest in high speed data V 1, and decreases in the order of low speed data V 2 and temporary stop data V 3.

Data registration section 61 sets priorities to multiple member data in order to shorten the time required for confirmation work. That is, data registration section 61 sets a first priority to high speed data V1, sets a second priority to low speed data V2, and sets a third priority to temporary stop data V3.

Even in the case where multiple of imaging speeds are registered, automatic data switching section 62 performs a control according to the control flow shown in FIG. 4. That is, in step S3, automatic data switching section 62 first sets high speed data V1 to which the first priority is given. In addition, in step S12 where the confirmation work by part camera 5 fails, automatic data switching section 62 automatically switches the member data from high speed data V1 to low speed data V2. Further, in step S12 where the confirmation work by part camera 5 fails for the second time, automatic data switching section 62 automatically switches the member data from low speed data V2 to temporary stop data V3.

In addition, since an operation of history record section 63 in step S7, an operation of downstream transmission section 64 in step S8, and a flow in step S10 when lots are changed are all the same as those of the case where multiple of allowable errors are registered, a description thereof will be omitted here.

5. Aspects and Advantageous Effects of Board Work Machine (Component Mounting Machine 1) of Embodiment According to one aspect of the present embodiment, since multiple member data are registered in advance for each characteristic of a member, when the performing situation of the work performing section changes, the member data can automatically be switched over. Due to this, being different from the post-processing countermeasure technique in the related art, the operator does not have to switch the member data manually. Therefore, in this board work machine, the effort that the operator has to expend is reduced. Further, since the member data are automatically switched over, component mounting machine 1 can continue the mounting work of components, and the production efficiency of circuit boards is maintained high.

Further, according to another aspect of the present embodiment, the multiple member data can be used in a preferred order. For example, in an application example of the embodiment, priorities are set to multiple imaging speeds in order to shorten the time required for confirmation work. As a result, a reduction in time for the confirmation work is realized.

Furthermore, according to a further aspect of the present embodiment, the highest performing precision is maintained as long as no error occurs. When an error occurs, the precision management is relaxed within the range where the performance of circuit boards can be ensured to thereby perform confirmation work again. Therefore, the mounting work is prevented from being suspended, thereby keeping the production efficiency of circuit boards at a high level.

Further, according to one aspect of the present embodiment, automatic data switching section 62 holds the member data in which the error is eliminated for use for members from then on. Here, it is assumed that an error occurs due to a slight difference in member, and this slight difference is often shared among members from that point on. Therefore, subsequent errors can be prevented from occurring in many cases by continuing to use the member data in which the error is eliminated. Further, there is no waste of time, labor, cost, and the like involved in repeating meaningless switching of the member data and re-performing work.

Further, according to another aspect of the present embodiment, automatic data switching section 62 can be configured to operate using the highest performing precision at the time of a lot change. To describe this more specifically, although the second member data or the third member data is used before and after a lot change, the first data is used for a new lot, and hence, there is sufficient possibility that no error occurs.

In addition, according to another aspect of the present embodiment, the member data used in multiple board work machines can always be matched.

Further, according to a further aspect of the present embodiment, component mounting machine 1 includes the traceability function, and when something problematic occurs, an investigation for tracing the automatic switching of the member data can be performed.

In addition, according to one aspect of the present embodiment, the advantageous effects described heretofore can be obtained for an error attributed to a slight difference in the shape of a member.

Further, according to another aspect of the present embodiment, the advantageous effects described heretofore can be obtained for an error involving the handling conditions of a member.

6. Application and Modification of the Embodiment

The board work machine is not limited to component mounting machine 1. For example, in a board appearance inspection machine, multiple allowable errors are registered for each characteristic of a component and can be configured to switch over automatically. As a result, a precision management at the time of inspection can be controlled variably, thereby making it possible to suppress the occurrence of a component recognition error. In addition, for multiple member data, registration items can also be adopted which are different from the allowable error of the shape data of a component or the imaging speed of the handling data. For example, in the case where multiple allowable errors regarding the shape of the position reference mark of a board are registered, an advantageous effect can be shared among multiple board work machines. Further, for example, in the case where multiple colors are registered for a component, an advantageous effect can be shared in the component confirmation work in component mounting machine 1 and the component inspection work in the board appearance inspection machine. The configurations and operations of the embodiment can also be applied or modified in various ways.

REFERENCE SIGNS LIST

1: component mounting machine, 2: board conveyance device, 3: component supply device, 4: component transfer device, 5: part camera, 6: control section, 61: data registration section, 62: automatic data switching section, 63: history record section, 64: downstream transmission section, 71: member database, 72: history database, 73: another board work machine, Er1: ultra-high precision data, Er2: high precision data, Er3: normal precision data

The invention claimed is:

1. A board work machine comprising:
   circuitry programmed to:
   register, in advance, multiple data for each characteristic of a member constituting a base material for a circuit board in accordance with a type and the characteristic of the member;
   control a constituent element of the board work machine to perform work using the member or perform work on the member while referring to one item of data from the multiple data for reference;
   automatically switch among the multiple data that is referred to in accordance with a performing situation of the work performed by the constituent element;
   set priorities to the multiple data corresponding to levels of performing precision of the work; and
   automatically switch among the multiple data that is referred to based on the priorities including:
      first using first data of the multiple data to which a first priority is set, the first priority corresponding to a highest level of performing precision, and
      when an error occurs in the work performed by the constituent element:
         automatically switch the first data to second data of the multiple data to which a second priority is set and causing the constituent element to perform the work again while referring to the second data; and
         hold currently-referred-to member data of the multiple data in which the error was able to be eliminated for use in performing the work from then on.

2. The board work machine according to claim 1, wherein the circuitry is programmed to use the first data when a lot including the member is changed.

3. The board work machine according to claim 1, wherein the circuitry is configured to transmit information that the multiple data has been automatically switched to another board work machine on a downstream side of the board work machine.

4. The board work machine according to claim 1, wherein the circuitry is configured to record information that the multiple data has been automatically switched.

5. The board work machine according to claim 1, wherein the multiple data comprises at least one of an allowable error of a physical dimension set for the each characteristic of the member, a standard value of the physical dimension, and a color or brightness of the member.

6. The board work machine according to claim 1, wherein the multiple data comprises a handling condition set for the each characteristic of the member.

7. A board work machine comprising:
   circuitry programmed to:
   register, in advance, multiple data for each characteristic of a member constituting a base material for a circuit board in accordance with a type and the characteristic of the member;
   control a constituent element of the board work machine to perform work using the member or perform work on the member while referring to one item of data from the multiple data for reference;
   automatically switch among the multiple data that is referred to in accordance with a performing situation of the work performed by the constituent element;
   set priorities to the multiple data corresponding to levels of performing precision of the work; and
   automatically switch among the multiple data that is referred to based on the priorities including:
      first using first data of the multiple data to which a first priority is set when a lot including the member is changed, the first priority corresponding to a highest level of performing precision, and
      when an error occurs in the work performed by the constituent element, automatically switch the first data to second data of the multiple data to which a second priority is set and causing the constituent element to perform the work again while referring to the second data.

8. The board work machine according to claim 7, wherein the circuitry is configured to hold currently-referred-to member data of the multiple data in which the error was able to be eliminated for use in performing the work from then on.

9. The board work machine according to claim 7, wherein the circuitry is configured to transmit information that the multiple data has been automatically switched to another board work machine on a downstream side of the board work machine.

10. The board work machine according to claim 7, wherein the circuitry is configured to record information that the multiple data has been automatically switched.

11. The board work machine according to claim 7, wherein the multiple data comprises at least one of an allowable error of a physical dimension set for the each characteristic of the member, a standard value of the physical dimension, and a color or brightness of the member.

12. The board work machine according to claim 7, wherein the multiple data comprises a handling condition set for the each characteristic of the member.

13. A board work machine comprising:
circuitry programmed to:
register, in advance, multiple data for each characteristic of a member constituting a base material for a circuit board in accordance with a type and the characteristic of the member;
control a constituent element of the board work machine to perform work using the member or perform work on the member while referring to one item of data from the multiple data for reference;
automatically switch among the multiple data that is referred to in accordance with a performing situation of the work performed by the constituent element;
set priorities to the multiple data corresponding to levels of performing precision of the work; and
when an error occurs in the work performed by the constituent element, hold currently-referred-to member data of the multiple data in which the error was able to be eliminated for use in performing the work from then on.

14. A board work machine comprising:
circuitry programmed to:
register, in advance, multiple data for each characteristic of a member constituting a base material for a circuit board in accordance with a type and the characteristic of the member;
control a constituent element of the board work machine to perform work using the member or perform work on the member while referring to one item of data from the multiple data for reference;
automatically switch among the multiple data that is referred to in accordance with a performing situation of the work performed by the constituent element;
use predetermined data of the multiple data when a lot including the member is changed.

* * * * *